(12) United States Patent
Hwang

(10) Patent No.: US 9,274,194 B2
(45) Date of Patent: Mar. 1, 2016

(54) METHOD AND APPARATUS FOR SIMULTANEOUSLY GENERATING MULTI-TYPE MAGNETIC RESONANCE IMAGES

(75) Inventor: Jin-young Hwang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 722 days.

(21) Appl. No.: 13/557,627

(22) Filed: Jul. 25, 2012

(65) Prior Publication Data

US 2013/0043868 A1 Feb. 21, 2013

(30) Foreign Application Priority Data

Aug. 19, 2011 (KR) .................. 10-2011-0083053

(51) Int. Cl.
*G01R 33/48* (2006.01)
(52) U.S. Cl.
CPC ........ *G01R 33/4828* (2013.01); *G01R 33/4816* (2013.01)
(58) Field of Classification Search
CPC .................. G01R 33/4816; G01R 33/4828
See application file for complete search history.

(56) References Cited

U.S. PATENT DOCUMENTS

| | | | |
|---|---|---|---|
| 4,694,836 A * | 9/1987 | Buikman et al. | 600/410 |
| 5,064,638 A | 11/1991 | Moore et al. | |
| 7,615,997 B2 * | 11/2009 | Graesslin et al. | 324/314 |
| 8,334,692 B2 * | 12/2012 | Harvey et al. | 324/307 |
| 2007/0164738 A1 | 7/2007 | Hoogenraad et al. | |
| 2010/0148773 A1 | 6/2010 | Chen et al. | |

FOREIGN PATENT DOCUMENTS

| | | |
|---|---|---|
| CN | 1950712 A | 4/2007 |
| CN | 101035462 A | 9/2007 |
| CN | 101268379 A | 9/2008 |
| CN | 101919696 A | 12/2010 |
| JP | 07-023924 A | 1/1995 |
| JP | 2008-119091 A | 5/2008 |
| JP | 2008-516640 A | 5/2008 |
| JP | 2008-264306 A | 11/2008 |
| JP | 2010-184115 A | 8/2010 |
| JP | 2010-284525 A | 12/2010 |
| WO | 2006/112497 A1 | 10/2006 |

OTHER PUBLICATIONS

Moore, Gregory, et al.; "Simultaneous Multinuclear Magnetic Resonance Imaging and Spectroscopy;" Magnetic Resonance in Medicine, vol. 19, No. 1; May 1, 1991; XP000209419.

(Continued)

*Primary Examiner* — Dixomara Vargas
(74) *Attorney, Agent, or Firm* — Cha & Reiter, LLC

(57) ABSTRACT

An electromagnetic wave signal, having a pulse train in which pulses having a plurality of frequencies corresponding to multi-type atomic nuclei are arranged in a line, is applied to a target object located in a magnetic field by using a radio frequency (RF) coil in the magnetic field. Data of magnetic resonance signals corresponding to the multi-type atomic nuclei is collected from the RF coil, and multi-type magnetic resonance images corresponding to the multi-type atomic nuclei are generated by using the data of the magnetic resonance signals.

22 Claims, 8 Drawing Sheets

(56) References Cited

OTHER PUBLICATIONS

Lee, S.W., et al.; "A Multinuclear Magnetic Resonance Imaging Technique-Simultaneous Proton and Sodium Imaging;" Magnetic Resonance Imaging, Elsevier Science, vol. 4, No. 4; Jan. 1, 1986; XP026307435.

Gonen, Oded, et al.; "Simultaneous and Interleaved Multinuclear Chemical-Shift Imaging, a Method for Concurrent, Localized Spectroscopy;" Journal of Magnetic Resonance, Series B, Academic Press, vol. 104, No. 1; May 1, 1994; XP000538759.

Kupce, Eriks, et al.; "Parallel Acquisition of Two-Dimensional NMR Spectra of Several Nuclear Species;" Journal of The American Chemical Society, vol. 128, No. 30; Aug. 1, 2006; XP55019082.

* cited by examiner

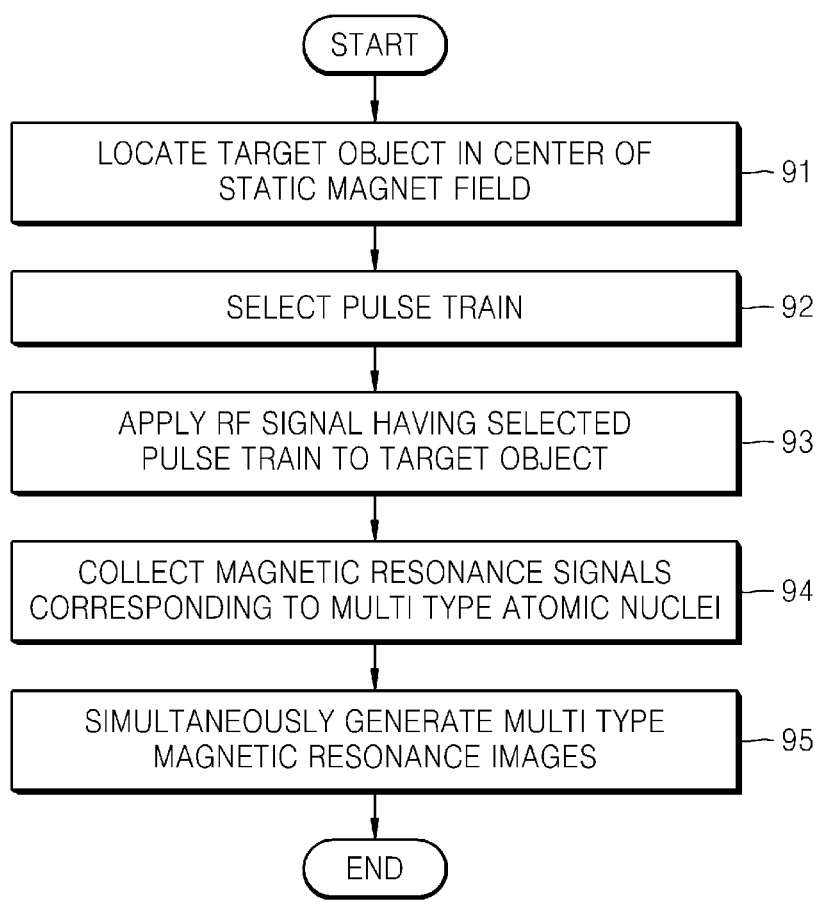

METHOD AND APPARATUS FOR SIMULTANEOUSLY GENERATING MULTI-TYPE MAGNETIC RESONANCE IMAGES

CLAIM OF PRIORITY

This application claims, pursuant to 35 U.S.C. 119(a), priority to and the benefit of the earlier filing date of Korean Patent Application No. 10-2011-0083053, filed on Aug. 19, 2011, in the Korean Intellectual Property Office, the disclosure of which is incorporated herein in its entirety by reference.

BACKGROUND OF THE INVENTION

1. Field of the Invention

The present invention relates to a method and apparatus for simultaneously generating multi-type magnetic resonance images.

2. Description of the Related Art

A variety of medical equipment for diagnosing patients is currently in use or being developed. In consideration of patient convenience and promptness of patient diagnosis results during a patient diagnosis process, the importance of medical equipment for showing cross-sectional images of internal human bodies, such as computed tomography (CT) apparatuses and magnetic resonance imaging (MRI) apparatuses, is emerging. In particular, MRI apparatuses have excellent image quality compared to other medical imaging devices, but it takes a long time to detect images, which may lead to image noise.

SUMMARY OF THE INVENTION

The present invention provides a method and apparatus for simultaneously and promptly generating multi-type magnetic resonance images. The present invention also provides a computer readable recording medium storing a program for executing the method. The present invention is not limited to these technical goals and other technical goals may be inferred from the following exemplary embodiments. The present invention will be clearly understood by those of ordinary skill in the art from the following descriptions.

According to an aspect of the present invention, there is provided an apparatus for generating a magnetic resonance image, the apparatus including: a coil for receiving a plurality of magnetic resonance signals generated by applying an electromagnetic wave signal having a plurality of pulses corresponding to multi-type atomic nuclei to a target object, wherein the coil receives a second magnetic resonance signal generated by applying at least one second pulse having a frequency corresponding to a second type of atomic nucleus to the target object between a time when at least one first pulse having a frequency corresponding to a first type of atomic nucleus is generated and a time when a first magnetic resonance signal generated by applying the at least one first pulse to the target object is received.

According to another aspect of the present invention, there is provided a method of generating a magnetic resonance image, the method including: applying at least one first pulse having a frequency corresponding to a first type of atomic nucleus to a target object; applying at least one second pulse having a frequency corresponding to a second type of atomic nucleus to the target object; receiving a second magnetic resonance signal generated by applying the at least one second pulse to the target object; and receiving a first magnetic resonance signal generated by applying the at least one first pulse to the target object after receiving the second magnetic resonance signal.

According to another aspect of the present invention, there is provided a computer readable recording medium having recorded thereon a computer program for executing the method of generating a magnetic resonance image, the method including: applying at least one first pulse having a frequency corresponding to a first type of atomic nucleus to a target object; applying at least one second pulse having a frequency corresponding to a second type of atomic nucleus to the target object; receiving a second magnetic resonance signal generated by applying the at least one second pulse to the target object; and receiving a first magnetic resonance signal generated by applying the at least one first pulse to the target object after receiving the second magnetic resonance signal.

BRIEF DESCRIPTION OF THE DRAWINGS

The above and other features and advantages of the present invention will become more apparent by describing in detail exemplary embodiments thereof with reference to the attached drawings in which:

FIG. 9 is a flowchart of a method of generating a magnetic resonance image according to the exemplary embodiment of the present invention.

DETAILED DESCRIPTION OF THE INVENTION

Preferred embodiments of the present invention will now be described in detail with reference to the accompanying drawings. In the following description, a detailed explanation of known related functions and constructions may be omitted to avoid unnecessarily obscuring the subject matter of the present invention. This invention may, however, be embodied in many different forms and should not be construed as limited to the exemplary embodiments set forth herein. The same reference numbers are used throughout the drawings to refer to the same or like parts. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

As used herein, expressions such as "at least one of," when preceding a list of elements, modify the entire list of elements and do not modify the individual elements of the list.

As used herein, the term "multi-type" refers to two or more different types of an item, such as different types of atomic nuclei, or different types or examples of magnetic resonance images.

Figure 1:
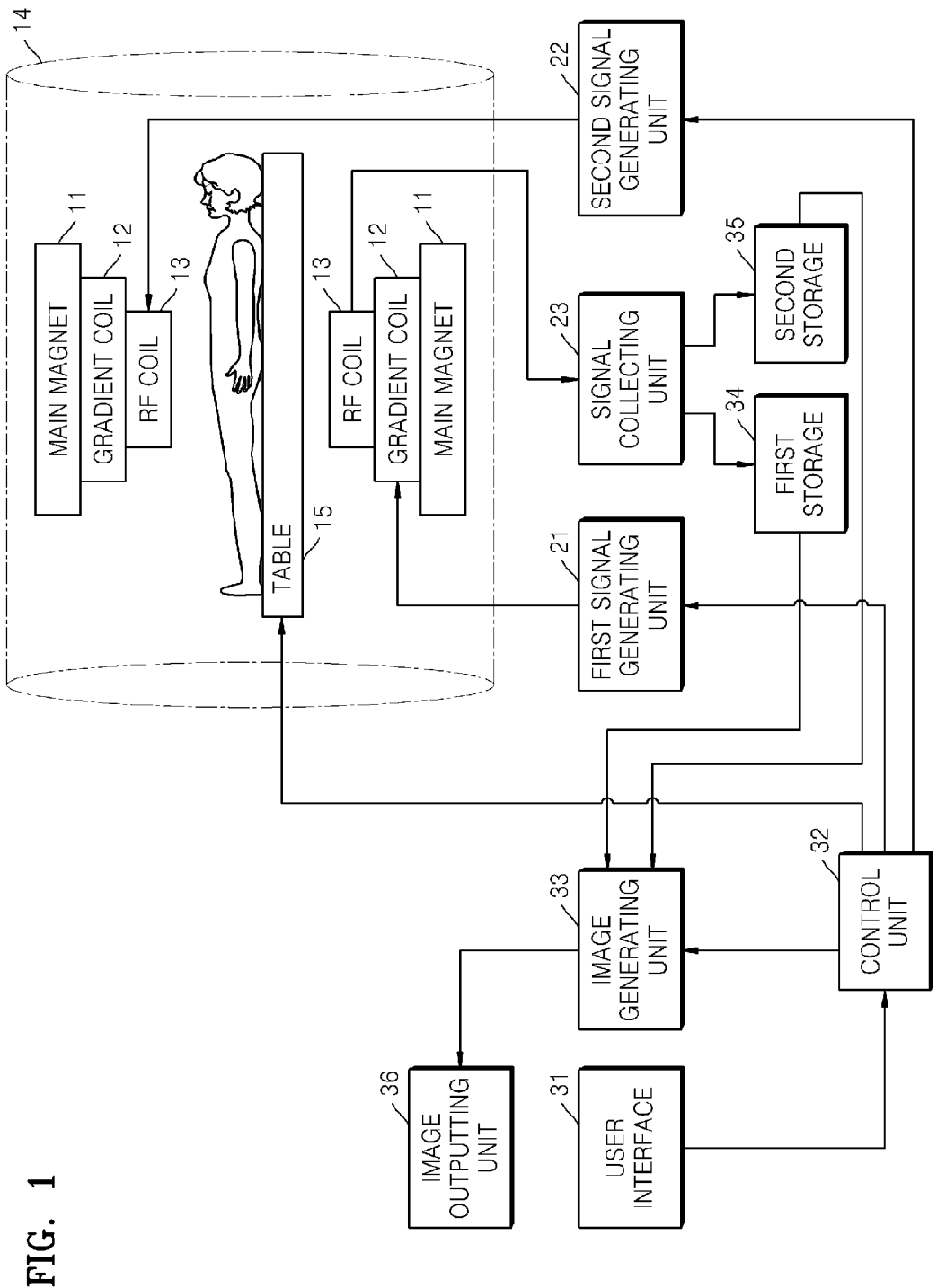
FIG. 1 is a diagram of a structure of a magnetic resonance imaging (MRI) apparatus according to an exemplary embodiment of the present invention.

FIG. 1 is a view illustrating a structure of a magnetic resonance imaging (MRI) apparatus according to the exemplary embodiment of the present invention. Referring to FIG. 1, the MRI apparatus may include a main magnet 11, a gradient coil 12, a radio frequency (RF) coil 13, a shield 14, a table 15, a first signal generating unit 21, a second signal generating unit 22, a signal collecting unit 23, a user interface 31, a control unit 32, an image generating unit 33, a first storage 34, a second storage 35, and an image outputting unit 36. The main magnet 11, the gradient coil 12, and the RF coil 13 are elements for generating a magnetic field to induce magnetic resonance signals from atomic nuclei inside a human body, and may be implemented as a magnet, coils, etc. The shield 14 blocks an electromagnetic wave generated by the RF coil 13 from being radiated to the outside. A target object, for example, a patient, lies on the table 15 inside the shield 14, and the table 15 may move by control of the control unit 32 to move in or out of the assembly of components 11-14, to position the patient for MRI photography.

The first signal generating unit 21, the second signal generating unit 22, and the signal collecting unit 23 are components for transmitting signals to generate the magnetic field in the gradient coil 12 and the RF coil 13 by the control of the control unit 32 or for collecting signals received in the RF coil 13 and providing the image generating unit 13 with the collected signals, and may be implemented as an oscillator, an amplifier, a modulator, a demodulator, an analog-to-digital converter (ADC), a digital-to-analog converter (DAC), etc. The user interface 31, the control unit 32, the image generating unit 33, the first storage 34, the second storage 35, and the image outputting unit 36 are components for controlling the first signal generating unit 21 and the second signal generating unit 22 or for processing signals collected by the signal collecting unit 23, and may be implemented as a computer and peripheral devices of the computer.

The main magnet 11 generates a static magnetic field for arranging directions of magnetic dipole moments of atomic nuclei inside the human body in one direction. Examples of the main magnet 11 for generating the static magnetic field include a permanent magnet, a room temperature electromagnet, a superconductivity electromagnet, etc. A magnetic field generated by the superconductivity electromagnet is strong and uniform, and thus the superconductivity electromagnet is mainly used as the main magnet 11. For example, if hydrogen atomic nuclei inside the human body are placed in the static magnetic field generated by the main magnet 11, directions of magnetic dipole moments of the hydrogen atomic nuclei are arranged in a direction of the static magnetic field generated by the main magnet 11 in order to go into a lower energy state. To maintain a thermal parallel state, the number of atomic nuclei in a low energy state is actually slightly greater than the number of atomic nuclei in a high energy state. In this regard, an energy difference between atomic nuclei in different energy states is proportional to an intensity of the static magnetic field generated by the main magnet 11, and has an intrinsic Larmor frequency associated with Larmor precession of the atomic nuclei. For example, if the intensity of the static magnetic field generated by the main magnet 11 is 1 Tesla, the Larmor frequency of a hydrogen atomic nucleus in the static magnetic field generated by the main magnet 11 is 42.58 MHz, and the Larmor frequency of a sodium atomic nucleus therein is 11.27 MHz.

The gradient coil 12 generates a gradient magnetic field that varies at a constant gradient with respect to each of a plurality of directions, for example, directions x, y, and z, in proportion to a distance from a reference location within the static magnetic field generated by the main magnet 11. In this regard, the reference location may be an origin point of a 3D coordinate system when a space including a static magnetic field generated by the main magnet 11 is presented as the 3D coordinate system. Each of the magnetic resonance signals received by the RF coil 13 has location information in a 3D space due to the gradient magnetic field generated by the gradient coil 12. The gradient coil 12 may comprise an X gradient coil for generating the gradient magnetic field that varies in the direction x, a Y gradient coil for generating the gradient magnetic field that varies in the direction y, and a Z gradient coil for generating the gradient magnetic field that varies in the direction z.

The RF coil 13 generates an electromagnetic wave signal having an RF corresponding to a type of an atomic nucleus, i.e., an RF signal, and applies the electromagnetic wave signal to the target object in order to transit the atomic nucleus from the low energy state to the high energy state. Atomic nuclei inside the target object are excited by the applied electromagnetic wave signal. In this regard, the target object is generally an MR image captured site of the human body, or may be a living body other than the human body or an inanimate object. For example, the RF coil 13 may generate the electromagnetic wave of 42.58 MHz to transit an energy state of the hydrogen atomic nucleus within the static magnetic field of 1 Tesla. Also, the RF coil 13 may generate the electromagnetic wave of 11.27 MHz to transit an energy state of the sodium atomic nucleus within the static magnetic field of 1 Tesla. If the electromagnetic wave signal generated by the RF coil 13 is applied to an atomic nucleus, the atomic nucleus is transited from a low energy state to a high energy state. Thereafter, if the electromagnetic wave signal generated by the RF coil 13 disappears, i.e. if the electromagnetic wave applied to the atomic nucleus disappears, the atomic nucleus radiates an electromagnetic wave having the same Larmor frequency while being transited from the high energy state to the low energy state.

The RF coil 13 receives an electromagnetic wave signal radiated from atomic nuclei inside the target object. The electromagnetic wave signal is referred to as a free induction decay (FID) signal. The FID signal is referred to as an echo signal with respect to the electromagnetic wave signal applied to the target object as a magnetic resonance signal used to generate a magnetic resonance image. A length of a time interval from a time point when the electromagnetic wave signal is applied to the target object, i.e. a time point when the electromagnetic wave signal is generated, to a time point when the electromagnetic wave signal is received from the target object is referred to as an echo time (TE). A length of a time interval when an application of the electromagnetic wave signal to the human body repeats is referred to as a repetition time (TR).

The RF coil 13 may be implemented as one coil having a function of generating an electromagnetic wave having an RF corresponding to a type of an atomic nucleus and a function of receiving an electromagnetic wave radiated from the atomic nucleus, or may be implemented as a transmission coil having the function of generating the electromagnetic wave having the RF corresponding to the type of the atomic nucleus and a reception coil having the function of receiving the electromagnetic wave radiated from the atomic nucleus. In particular, according to the present embodiment of FIG. 1, the reception coil of the RF coil 13 may be implemented as a dual tuned coil capable of receiving several frequencies in one coil, may be implemented as a multi-channel coil capable of simultaneously receiving a plurality of magnetic resonance signals, or may be implemented as a dual tuned multi-channel coil.

The user interface 31 receives a command from an operator of the MRI apparatus of FIG. 1 and outputs the command to the control unit 32. The user interface 31 may be implemented as a general input device of a computer, such as a keyboard and a mouse. The image outputting unit 34 outputs the magnetic resonance image generated by the image generating unit 33. The image outputting unit 34 may be implemented as a general output device of the computer such as a monitor. The control unit 32 controls the first signal generating unit 21, the second signal generating unit 22, the signal collecting unit 23, and the image generating unit 33 according to the command output from the user interface 31. The image generating unit 33 generates a magnetic resonance image by using magnetic resonance signals that are collected by the signal collecting unit 23 and are stored in the first storage 34 and the second storage 35. The control unit 32 and the image generating unit 33 may be implemented as a high performance computer capable of promptly processing a large amount of data required to generate the magnetic resonance image. Meanwhile, it will be understood by one of ordinary skill in the art that the terms "generating the magnetic resonance image" may be replaced by various terms such as reconstructing the magnetic resonance image.

The control unit 32 generates a control signal indicating an alternating signal having a frequency varying at a certain gradient with respect to each of the directions x, y, and z, and outputs the control signal to the second signal generating unit 22. The first signal generating unit 21 generates the alternating signal having a frequency varying at a constant gradient with respect to each of the directions x, y, and z according to the control signal received from the control unit 32, and outputs the alternating signal to the gradient coil 12. The gradient coil 12 generates a gradient magnetic field that varies at a constant gradient with respect to each of the directions x, y, and z according to the alternating signal received from the first signal generating unit 21. The control unit 32 generates a control signal indicating a pulse train, and outputs the control signal to the second signal generating unit 22. The second signal generating unit 22 generates an alternating signal having the pulse train according to the control signal received from the control unit 32, and outputs the alternating signal to the RF coil 13. The RF coil 13 generates an electromagnetic wave signal having the pulse train according to the alternating signal received from the second signal generating unit 22. The first signal generating unit 21 and the third signal generating unit 32 may be implemented as ADCs for converting analog signals received from the control unit 32 into digital signals, oscillators for generating source signals, modulators for modulating the source signals according to signals received from the control unit 32, amplifiers for amplifying the signals modulated by the modulators, etc. Such amplified signals are sent to the coils 12, 13.

The signal collecting unit 23 collects magnetic resonance signals induced by atomic nuclei through the RF coil 13. The signal collecting unit 23 may be implemented as an amplifier for amplifying magnetic resonance signals received from the RF coil 13, a demodulator for demodulating the magnetic resonance signals amplified by the amplifier, a DAC for converting analog magnetic resonance signals demodulated by the demodulator into digital magnetic resonance signals, etc. The magnetic resonance signals converted into digital form are separately stored in the first storage 34 and the second storage 35. The first storage 34 and the second storage 35 are not necessarily physically separated storages but are spaces for separately storing different types of magnetic resonance signals. For example, the first storage 34 and the second storage 35 may be different storage regions of a hard disk.

Since a hydrogen atom is a component of a water molecule occupying more than 70% of the human body, intensities of magnetic resonance signals induced from hydrogen atomic nuclei are much higher than intensities of magnetic resonance signals induced from different types of atomic nuclei of the human body. In general, a magnetic resonance image is generated by using magnetic resonance signals induced from hydrogen atomic nuclei. The magnetic resonance image (hereinafter referred to as a "1H magnetic resonance image") generated by using magnetic resonance signals induced from hydrogen atomic nuclei provides anatomy information about the inside of the human body. Meanwhile, although sodium atoms also occupy the human body in a high amount, since the proportion of sodium atoms is much lower than the proportion of hydrogen atoms, magnetic resonance signals induced from sodium atomic nuclei have very low intensities and a low signal to noise ratio (SNR). Accordingly, a magnetic resonance image (hereinafter referred to as a "23Na magnetic resonance image") is generated by repeatedly collecting magnetic resonance signals induced from sodium atomic nuclei for a long time and using an average of the collected magnetic resonance signals. The 23Na magnetic resonance image provides metabolism information about the inside of the human body.

The RF coil 13 generates an electromagnetic wave from an alternating current applied from the second signal generating unit 22 to the RF coil 13, and receives an electromagnetic wave by a signal collection of the signal collecting unit 23, and thus it is possible to freely adjust a time when the RF coil 13 generates a pulse and a time when the RF coil 13 receives the pulse. In general, the TE of a magnetic resonance signal of a hydrogen atomic nucleus is much longer than the TE of a magnetic resonance signal of a sodium atomic nucleus. In view of this, a pulse train of the RF coil 13 for simultaneously generating multi-type magnetic resonance signals will now be described below.

The control unit 32 generates a control signal indicating a pulse train in which pulses having a plurality of frequencies corresponding to multi-type atomic nuclei are arranged in a line or sequentially, and outputs the control signal to the second signal generating unit 22. The second signal generating unit 22 generates an alternating signal having the pulse train in which pulses having the plurality of frequencies corresponding to multi-type atomic nuclei are arranged in a line or sequentially according to the control signal received from the control unit 32, and outputs the alternating signal to the RF coil 13. The RF coil 13 generates an electromagnetic wave signal having the pulse train in which pulses having the plurality of frequencies corresponding to multi-type atomic nuclei are arranged in a line or sequentially according to the alternating signal received from the second signal generating unit 22. The electromagnetic wave signal generated by the RF coil 13 is applied to the target object. For example, to simultaneously generate the 1H magnetic resonance image and the 23Na magnetic resonance image, the RF coil 13 may generate an electromagnetic wave signal having a pulse train in which a pulse corresponding to a hydrogen atomic nucleus and a pulse corresponding to a sodium atomic nucleus are arranged in a line or sequentially.

More specifically, to almost simultaneously collect a magnetic resonance signal of a hydrogen atomic nucleus and a magnetic resonance signal of a sodium atomic nucleus according to the exemplary embodiment of the present invention, shown in FIG. 1, the RF coil 13 may generate at least one second pulse having a frequency corresponding to a second type of atomic nucleus and receive a second echo signal generated by applying the second pulse to the target object, between a time when at least one first pulse having a frequency corresponding to a first type of atomic nucleus is generated and a time when a first echo signal generated by applying the first pulse to the target object is received. For example, the RF coil 13 may generate at least one pulse having a frequency corresponding to a sodium atomic nucleus and may receive an echo signal generated by applying the pulse to the target object, between a time when at least one pulse having a frequency corresponding to a hydrogen atomic nucleus is generated and a time when an echo signal generated by applying the pulse to the target object is received.

Figure 2:
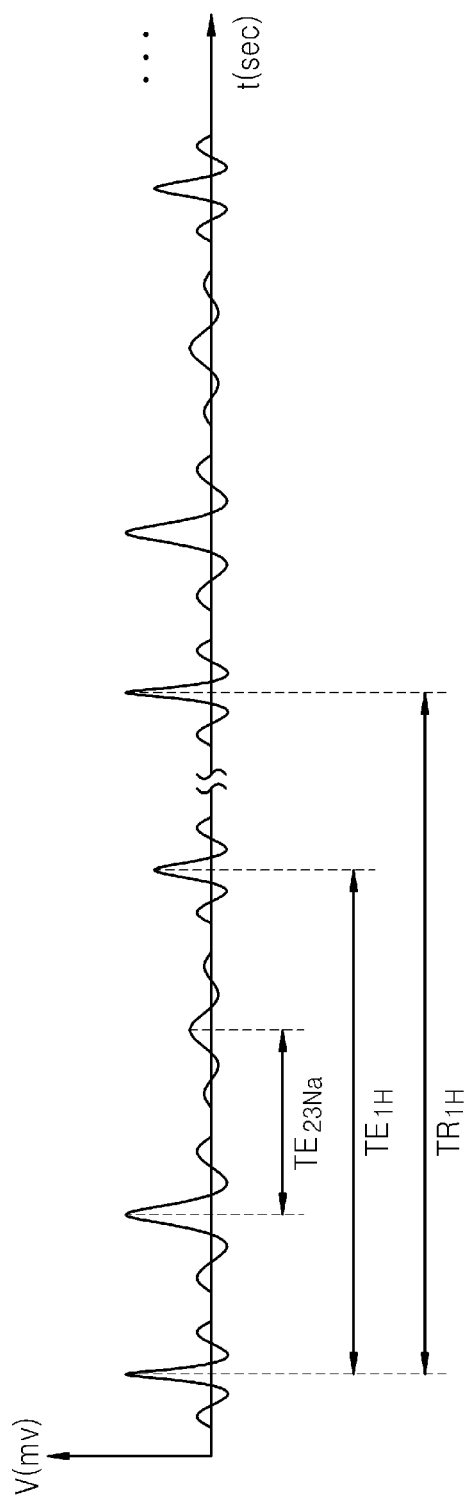
FIG. 2 is a diagram of an example of a pulse train generated by a radio frequency (RF) coil of the apparatus of FIG. 1.

FIG. 2 is a diagram of an example of a pulse train generated by the RF coil 13 of FIG. 1. A unit of the horizontal x axis, as a time axis, is seconds. A unit of the vertical y axis is millivolts (mV). A Larmor frequency of a hydrogen atomic nucleus is greater than a Larmor frequency of a sodium atomic nucleus, and thus a pulse width of an electromagnetic wave signal having a frequency corresponding to the hydrogen atomic nucleus is smaller than a pulse width of an electromagnetic wave signal having a frequency corresponding to the sodium atomic nucleus.

Referring to FIG. 2, a $TE_{23Na}$ of an electromagnetic wave signal having a frequency corresponding to a sodium atomic nucleus is included in a $TE_{1H}$ of an electromagnetic wave signal having a frequency corresponding to a hydrogen atomic nucleus. The RF coil 13 may generate a one second pulse having a frequency corresponding to a second type of atomic nucleus, i.e., the sodium atomic nucleus and may receive a second echo signal generated by applying the second pulse to the target object, between a time when one first pulse having a frequency corresponding to a first type of atomic nucleus, i.e. the hydrogen atomic nucleus, is generated and a time when a first echo signal generated by applying the first pulse to a target object is received. As described above, the RF coil 13 generates an electromagnetic wave signal having a pulse train in which the $TE_{23Na}$ of the electromagnetic wave signal having the frequency corresponding to the sodium atomic nucleus is included in the $TE_{1H}$ of the electromagnetic wave signal having the frequency corresponding to the hydrogen atomic nucleus, and thus magnetic resonance signals induced from hydrogen atomic nuclei and magnetic resonance signals induced from sodium atomic nuclei may be almost simultaneously received.

Figure 3:
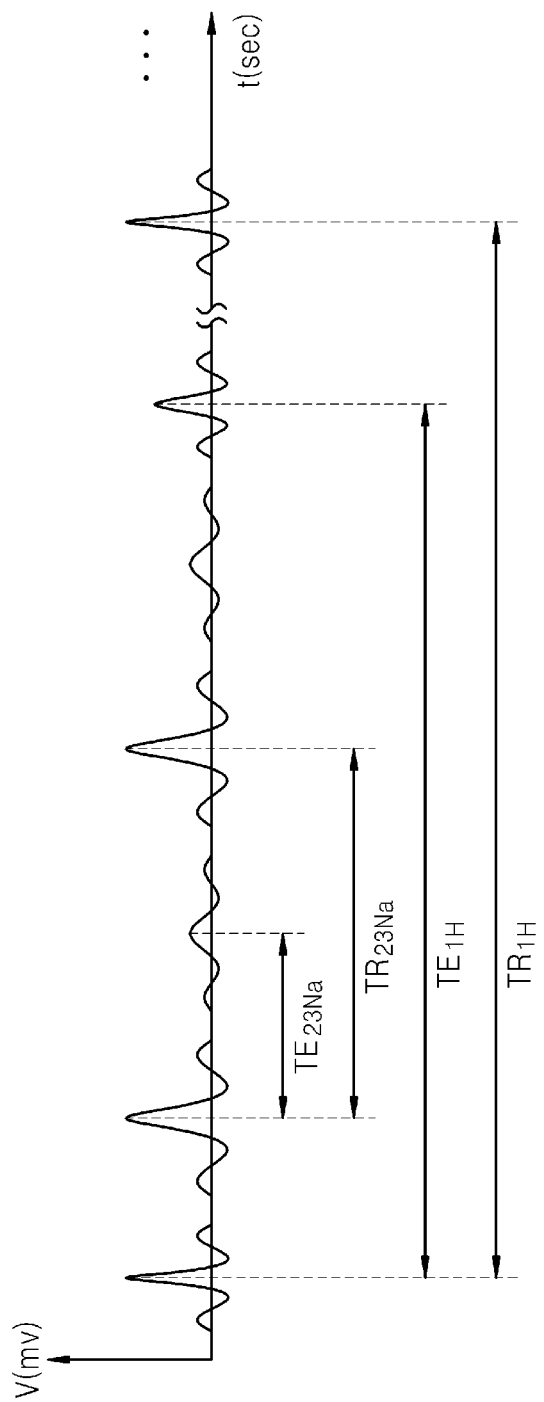
FIG. 3 is a diagram of another example of a pulse train generated by the RF coil of the apparatus of FIG. 1.

FIG. 3 is a diagram of another example of a pulse train generated by the RF coil 13 of FIG. 1. Referring to FIG. 3, two $TEs_{23Na}$ of an electromagnetic wave signal having a frequency corresponding to a sodium atomic nucleus is included in a $TE_{1H}$ of an electromagnetic wave signal having a frequency corresponding to a hydrogen atomic nucleus. The RF coil 13 may generate a plurality of second pulses having a frequency corresponding to a second type of atomic nucleus, i.e., the sodium atomic nucleus and may receive second echo signals generated by applying the second pulses to the target object, between a time when one first pulse having a frequency corresponding to a first type of atomic nucleus, i.e. the hydrogen atomic nucleus, is generated and a time when a first echo signal generated by applying the first pulse to a target object is received.

Since intensities of magnetic resonance signals induced from sodium atomic nuclei are much lower than intensities of magnetic resonance signals induced from hydrogen atomic nuclei, it is advisable to repeatedly measure the magnetic resonance signals induced from sodium atomic nuclei. The RF coil 13 generates an electromagnetic wave signal having a pulse train in which the two $TEs_{23Na}$ of the electromagnetic wave signal having the frequency corresponding to the sodium atomic nucleus is included in the $TE_{1H}$ of an electromagnetic wave signal having the frequency corresponding to the hydrogen atomic nucleus, and thus magnetic resonance signals induced from sodium atomic nuclei may be received twice while magnetic resonance signals induced from hydrogen atomic nuclei are received once. Although two $TEs_{23Na}$ are included in one $TE_{1H}$ in FIG. 3, it will be understood by one of ordinary skill in the art, using the exemplary embodiment of the present invention shown in FIG. 1, that other numbers of $TEs_{23Na}$ may be included in one $TE_{1H}$.

In FIGS. 2 and 3, the pulses generated by the RF coil 13 have a direction of 90 degrees with respect to a direction of the static magnetic field generated by the main magnet 11. For example, if the direction of the static magnetic field generated by the main magnet 11 is along or parallel to a z axis and a pulse having a direction of 90 degrees is applied to an atomic nucleus arranged in the static magnetic field, the longitudinal magnetization of the atomic nucleus is flipped to be arranged in a direction parallel to the x-y plane. Such a method of generating a magnetic resonance image, using magnetic resonance images generated from atomic nuclei by applying the pulse having the direction of 90 degrees to the longitudinal magnetization of an atomic nucleus, is referred to as gradient echo imaging. The gradient echo imaging is simple but magnetic resonance signals collected by using the gradient echo imaging have somewhat weak intensities, and thus spin echo imaging is generally used. The spin echo imaging method generates a magnetic resonance image using magnetic resonance signals generated from atomic nuclei to which the pulse (hereinafter referred to as a "90 degree pulse") having the direction of 90 degrees is applied and then a pulse (hereinafter referred to as a "180 degree pulse") having a direction of 180 degrees is applied. A pulse train generated by the RF coil 13 to simultaneously generate multi-type magnetic resonance images using the spin echo imaging will now be described below.

Figure 4:
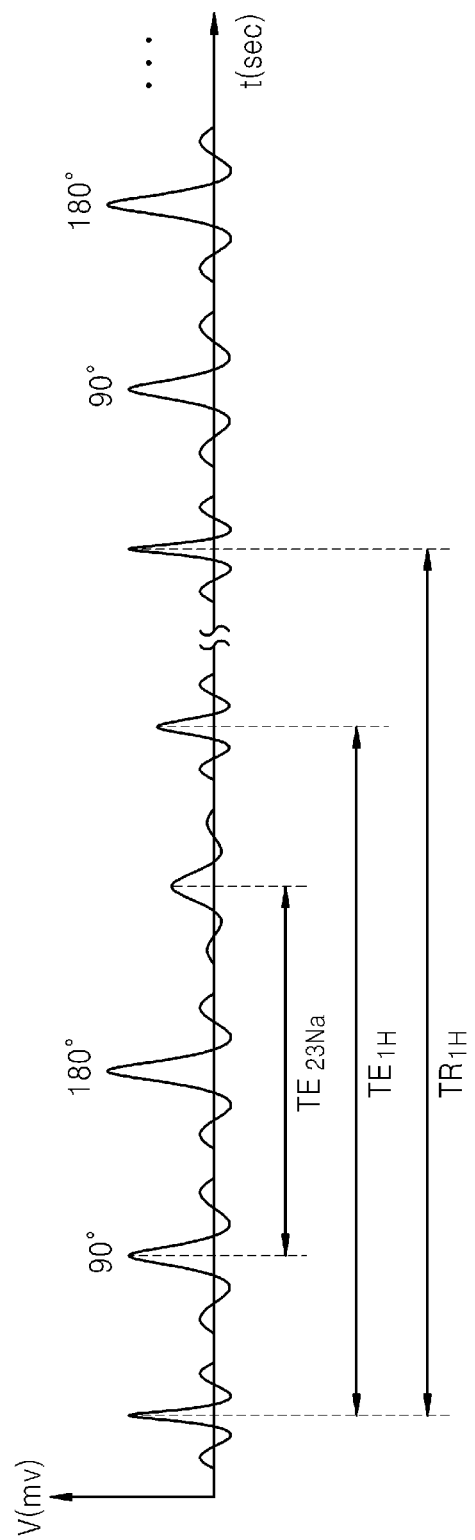
FIG. 4 is a diagram of another example of a pulse train generated by the RF coil of the apparatus of FIG. 1.

FIG. 4 is a diagram of another example of a pulse train generated by the RF coil 13 of FIG. 1. Referring to FIG. 4, a $TE_{23Na}$ of a 90 degree pulse and a 180 degree pulse each having a frequency corresponding to a sodium atomic nucleus is included in a $TE_{1H}$ of an electromagnetic wave signal having a frequency corresponding to a hydrogen atomic nucleus. The RF coil 13 may generate a plurality of second pulses, i.e. the 90 degree pulse and the 180 degree pulse, each having a frequency corresponding to a second type of atomic nucleus, i.e., the sodium atomic nucleus and may receive a second echo signal generated by applying the second pulses to the target object, between a time when a first pulse having a frequency corresponding to a first type of atomic nucleus, i.e. the hydrogen atomic nucleus, is generated and a time when a first echo signal generated by applying the first pulse to a target object is received.

Since intensities of magnetic resonance signals induced from sodium atomic nuclei are much lower than intensities of magnetic resonance signals induced from hydrogen atomic nuclei, it is advisable to make higher intensities of the magnetic resonance signals induced from sodium atomic nuclei. The RF coil 13 generates an electromagnetic wave signal having a pulse train in which the $TE_{23Na}$ of the 90 degree pulse and the 180 degree pulse each having the frequency corresponding to the sodium atomic nucleus is included in the $TE_{1H}$ of the electromagnetic wave signal having the frequency corresponding to the hydrogen atomic nucleus, and thus magnetic resonance signals induced from sodium atomic nuclei may be collected using the gradient echo imaging, and magnetic resonance signals induced from hydrogen atomic nuclei may be collected using the spin echo imaging.

Figure 5:
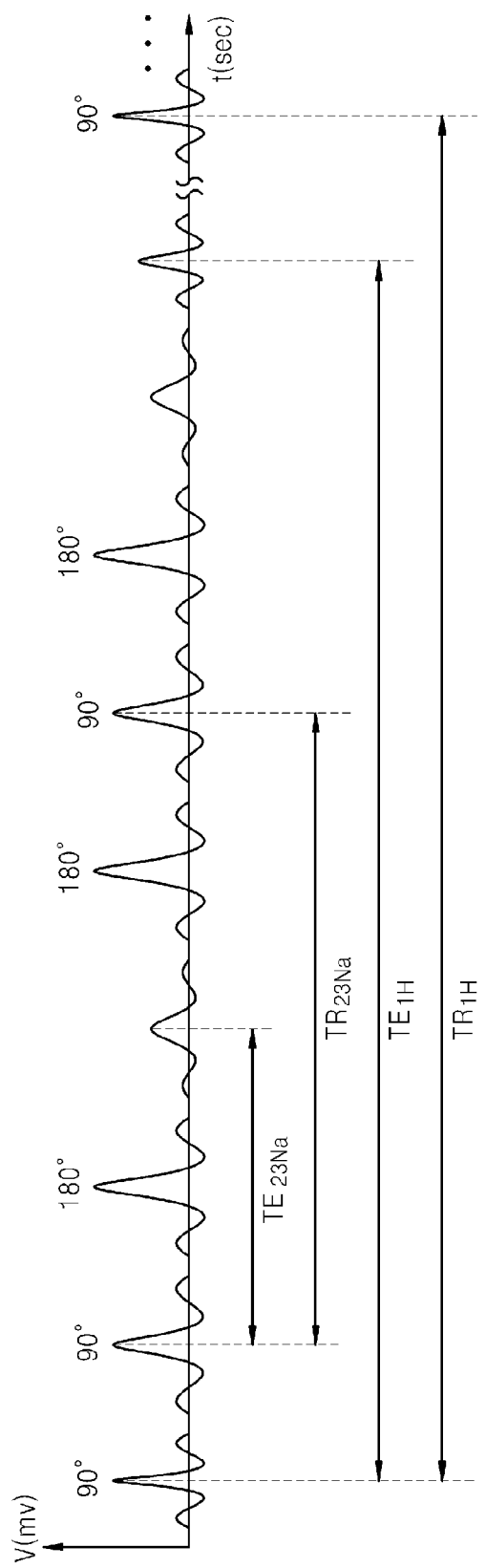
FIG. 5 is a diagram of another example of a pulse train generated by the RF coil of the apparatus of FIG. 1.

FIG. 5 is a diagram of another example of a pulse train generated by the RF coil 13 of FIG. 1. Referring to FIG. 5, a $TE_{23Na}$ of a 90 degree pulse and a 180 degree pulse each having a frequency corresponding to a sodium atomic nucleus is included between a 90 degree pulse and a 180 degree pulse each having a frequency corresponding to a hydrogen atomic nucleus. The RF coil 13 may generate a plurality of second pulses, i.e. the 90 degree pulse and the 180 degree pulse, each having a frequency corresponding to a second type of atomic nucleus, i.e., the sodium atomic nucleus and may receive a second echo signal generated by applying the second pulses to the target object, between a time when one of a plurality of first pulses, i.e. the 90 degree pulse and the 180 degree pulse, each having a frequency corresponding to a first type of atomic nucleus, i.e. the hydrogen atomic nucleus, is generated and a time when another pulse is generated.

Also, another $TE_{23Na}$ of the 90 degree pulse and the 180 degree pulse each having the frequency corresponding to the sodium atomic nucleus is included between the 180 degree pulse having the frequency corresponding to the hydrogen atomic nucleus and a TE induced from the hydrogen atomic nucleus. The RF coil 13 may generate a plurality of third pulses, i.e. the 90 degree pulse and the 180 degree pulse, each having the frequency corresponding to the second type of atomic nucleus, i.e., the sodium atomic nucleus and may receive a third echo signal generated by applying the third pulses to the target object, between a time when, among the plurality of first pulses, i.e. the 90 degree pulse and the 180 degree pulse, each having the frequency corresponding to the first type of atomic nucleus, i.e. the hydrogen atomic nucleus, the 180 degree pulse is generated and a time when a first echo signal generated by applying the 90 degree pulse and the 180 degree pulse to the target object is received.

In FIG. 5, magnetic resonance signals are collected using the spin echo imaging with respect to both the hydrogen atomic nucleus and the sodium atomic nucleus. The spin echo imaging generates the 180 degree pulse at a middle time between the time when a 90 degree pulse is generated and the time when an echo signal is received. Thus, the $TE_{23Na}$ of the 90 degree pulse and the 180 degree pulse with respect to the sodium atomic nucleus may be inserted between the time when the 90 degree pulse is generated and the time when the 180 degree pulse is generated with respect to the hydrogen atomic nucleus, and another $TE_{23Na}$ may be inserted between the time when the 180 degree pulse is generated and the time when the echo signal is received. The RF coil 13 generates the electromagnetic wave signal having the pulse train described above, and thus magnetic resonance signals induced from sodium atomic nuclei and magnetic resonance signals induced from hydrogen atomic nuclei may be collected using the spin echo imaging, and magnetic resonance signals induced from sodium atomic nuclei may be received twice while magnetic resonance signals induced from hydrogen atomic nuclei are received once.

As described above, although sodium atoms occupy the human body in a high amount, since the proportion of sodium atoms are much lower than the proportion of hydrogen atoms, it is necessary to repeatedly collect magnetic resonance signals induced from sodium atomic nuclei. For example, the signal collecting unit 23 may collect magnetic resonance signals corresponding to sodium atomic nuclei several times while collecting magnetic resonance signals corresponding to hydrogen atomic nuclei one time. More specifically, the signal collecting unit 23 may collect magnetic resonance signals corresponding to sodium atomic nuclei several times with respect to a part of a capturing space of the target object while uniformly collecting magnetic resonance signals corresponding to hydrogen atomic nuclei one time with respect to a whole MR image capturing space of the target object.

Figure 6:
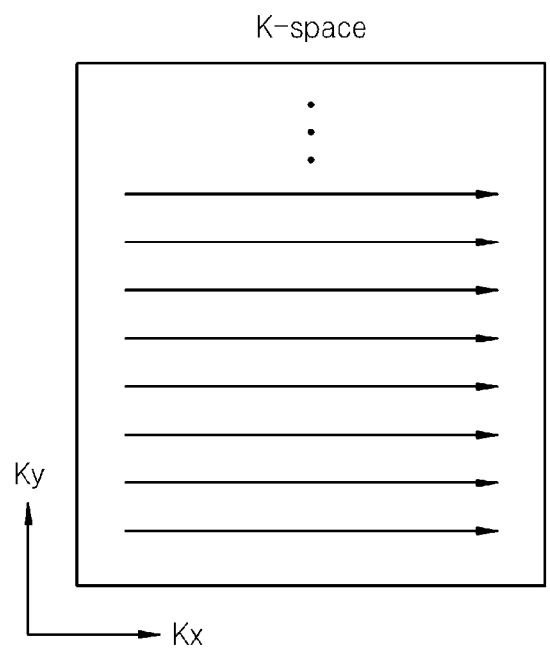
FIG. 6 is a diagram of an example of collecting magnetic resonance signals induced from hydrogen atomic nuclei in a signal collecting unit of the apparatus of FIG. 1.

FIG. 6 is a diagram of an example of collecting magnetic resonance signals induced from hydrogen atomic nuclei in the signal collecting unit 23 of FIG. 1. A brief description of the signal collection unit 23 that collects magnetic resonance signals is provided. It is assumed that a space for capturing a target object is a 2D k-space. In general, a k-space in a magnetic resonance imaging field refers to a frequency space obtained by performing a Fourier transform on the space for capturing the target object. If the first signal generating unit 21 outputs an alternating signal having a frequency varying at a constant gradient with respect to each of directions x, y, and z according to a control signal received from the control unit 32 to the gradient coil 12, the gradient coil 12 generates a gradient magnetic field that varies at a certain gradient with respect to each of the directions x, y, and z. The gradient magnetic field allows atomic nuclei in the space for capturing the target object to have different phases. The signal collection unit 23 collects magnetic resonance signals induced from atomic nuclei having different phases in the space for capturing the target object in response to the alternating signal having the frequency varying at a constant gradient with respect to each of directions x, y, and z. The collected magnetic resonance signals constitute the 2D k space.

Referring to FIGS. 1 and 6, the first signal generating unit 21 is fixed to an initial sampling frequency in the vertical direction y according to the control signal of the control unit 32, and outputs an alternating current having a frequency varying at a constant gradient with respect to a distance from an origin point in the horizontal direction x to the gradient coil 21. The gradient coil 12 generates a gradient magnetic field that varies with a constant gradient with respect to the direction x according to the alternating current. The sampling frequencies are represented as the rightward arrows in FIG. 6. Accordingly, as shown in FIG. 6, the signal collecting unit 23 collects the magnetic resonance signals at a sampling interval in the direction x at a sampling point on the axis y in the 2D k space. Thereafter, the first signal generating unit 12 is changed to a next sampling frequency in the direction y, represented by a next higher or lower rightward arrow, from the initial sampling frequency according to the control signal of the control unit 32, and outputs an alternating current having a frequency varying at a constant gradient with respect to the distance from the origin point in the direction x to the gradient coil 21. Frequency varies at sampling points on the axis y at a constant gradient similar to the sampling points on the axis x. The gradient coil 12 generates a gradient magnetic field that varies at a constant gradient with respect to the direction x according to the alternating current. Accordingly, the signal collecting unit 23 collects the magnetic resonance signals at a sampling interval in the direction x at another sampling point on the axis y in the 2D k space. Such a process is repeatedly performed at all sampling points on the arrows spaced apart along the axis y in the 2D k space, and thus the magnetic resonance signals are uniformly collected one time with respect to the whole 2D k space.

Figure 7:
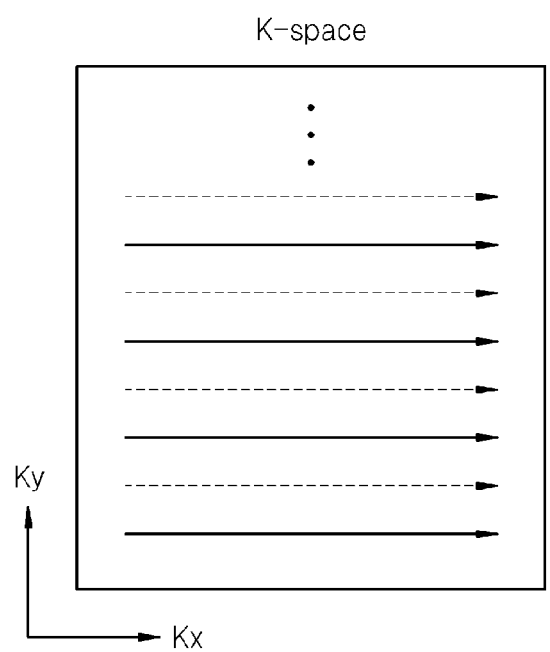
FIG. 7 is a diagram of an example of collecting magnetic resonance signals induced from sodium atomic nuclei in the signal collecting unit of the apparatus of FIG. 1.

FIG. 7 is a diagram of an example of collecting magnetic resonance signals induced from sodium atomic nuclei in the signal collecting unit 23 of FIG. 1. Referring to FIGS. 1 and 7, the first signal generating unit 21 fixes an initial sampling frequency in a vertical direction y according to a control signal of the control unit 32, and outputs an alternating current having a frequency varying at a constant gradient with respect to a distance from an origin point in a horizontal direction x to the gradient coil 21. The gradient coil 12 generates a gradient magnetic field that varies with a constant gradient with respect to the direction x according to the alternating current. Accordingly, the signal collecting unit 23 collects the magnetic resonance signals at a sampling interval in the direction x at a sampling point on the axis y in a 2D k space, represented by a rightward arrow. Thereafter, the first signal generating unit 21 skips a next sampling frequency in the direction y from the initial sampling frequency according to the control signal of the control unit 32, changes to a third sampling frequency, and outputs an alternating current having a frequency varying at a constant gradient with respect to the distance away from the origin point in the direction x to the gradient coil 12. Referring to FIG. 7, the skipped sampling frequencies are represented by dotted arrows, while sampled frequencies are represented by solid arrows. The gradient coil 12 generates a gradient magnetic field that varies at a constant gradient with respect to the direction x according to the alternating current. Accordingly, the signal collecting unit 23 collects the magnetic resonance signals at a sampling interval in the direction x at the third sampling point on the axis y in the 2D k space. Such a process is repeatedly performed two times at odd sampling points on the solid arrows spaced apart along the y axis; that is, unskipped sampling points on the solid arrows in FIG. 7 along the axis y in the 2D k space, and thus the magnetic resonance signals are collected two times with respect to a part of the 2D k space.

Referring to FIG. 1, the image generating unit 33 simultaneously generates multi-type magnetic resonance images corresponding to multi-type atomic nuclei using data of the magnetic resonance signals collected by the signal collecting unit 23. For example, the image generating unit 33 may simultaneously generate a 1H magnetic resonance image and a 23Na magnetic resonance image using the data of the magnetic resonance signals collected by the signal collecting unit 23. More specifically, the image generating unit 33 generates the 1H magnetic resonance image using magnetic resonance signals stored in the first storage 34 and simultaneously generates the 23Na magnetic storage image using magnetic resonance signals stored in the second storage 35. The magnetic resonance signals stored in the first storage 34 are induced from hydrogen atomic nuclei. The magnetic resonance signals stored in the second storage 35 unit are induced from sodium atomic nuclei.

Since the magnetic resonance signals stored in the second storage 35 unit are collected several times with respect to a part of a space for capturing a target object, the image generating unit 33 determines some of magnetic resonance signals present in the space for capturing the target object, i.e., the 2D k space, from an average of the magnetic resonance signals collected several times. Thereafter, the image generating unit 33 estimates magnetic resonance signals that are not collected from the magnetic resonance signals present in the 2D k space based on the determined magnetic resonance signals, and generates the 23Na magnetic resonance image using the magnetic resonance signals collected by the signal collecting unit 23 and the estimated magnetic resonance signals. More specifically, the image generating unit 33 may calculate a predetermined function indicating a relationship of locations and values of the magnetic resonance signals in the space for capturing the target object, i.e., the 2D k space, based on the magnetic resonance signals collected by the signal collecting unit 23, and sequentially substitute location values of magnetic resonance signals that are not collected by the signal collecting unit 23 from among the magnetic resonance signals corresponding to sodium atomic nuclei for the function, and thus estimating values of the magnetic resonance signals that are not collected by the signal collecting unit 23. In this regard, algorithms and methods known in the art may be used by the present invention, to be used to reconstruct magnetic resonance signals in an empty space of the 2D k space by not wholly but partially filling the 2D k space with the magnetic resonance signals. Such algorithms and methods include a compressed sensing (CS) algorithm, a generalized series (GS) algorithm, a high-order generalized series (HGS) algorithm, etc. These algorithms are used to generate a magnetic resonance image mainly at high speed.

Furthermore, the magnetic resonance signals induced from sodium atomic nuclei may be repeatedly collected using multi-channel coils. Multi-channel coils refer to reception coils installed at different locations in a static magnetic field generated by the main magnet 11, i.e., the space for capturing the target object. Since reception coils are installed at different locations, sensitivities of reception coils with respect to the magnetic resonance signals vary according to a location of the target object from which the magnetic resonance signals are radiated. In general, the closer the magnetic resonance signal induced from an atomic nucleus is to a reception coil, the higher the intensity of the magnetic resonance signal. Thus, according to this characteristic, magnetic resonance signals located at different parts of the target object are simultaneously obtained through reception coils by applying different weights of the magnetic resonance signals received according to locations of the reception coils, and a whole magnetic resonance image may be promptly generated by combining partial images generated by using the obtained and weighted magnetic resonance signals. This is called parallel magnetic resonance imaging.

If the RF coil 13 includes multi-channel coils having frequencies corresponding to sodium atomic nuclei, the signal collecting unit 23 may simultaneously collect the magnetic resonance signals corresponding to the sodium atomic nuclei through the reception coils installed at different locations in the space for MR image capturing the target object. The image generating unit 33 allocates different weights with respect to channels of multi-channel coils, i.e., reception coils, based on location information regarding the magnetic resonance signals collected by the signal collecting unit 23. The image generating unit 33 simultaneously generates magnetic resonance images with respect to different parts of the target object by using the magnetic resonance signals allocated with weights, and combines the weighted magnetic resonance images, thereby generating a whole magnetic resonance image of the target.

Figure 8:
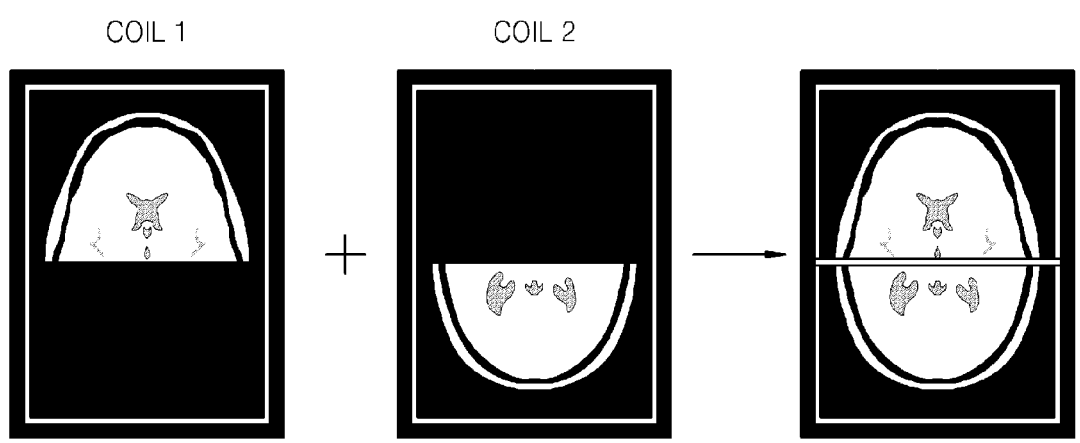
FIG. 8 is a diagram of an example of generating an image in an image generating unit of the apparatus of FIG. 1.

FIG. 8 is a diagram of an example of generating an image in the image generating unit 33 of FIG. 1. In FIG. 8, multi-channel coils of the RF coil 13 include a reception coil located in an upper side of a static magnetic field generated by the main magnet 11, i.e. a space for capturing an image of a human brain, and a reception coil located in a lower side of the space for capturing the image of the human brain. Referring to FIG. 8, the image generating unit 33 generates a magnetic resonance image with respect to an upper side of the human brain by using magnetic resonance signals induced from atomic nuclei located in the upper side of the space for capturing the image of the human brain, and received, for example, from a first coil, and generates a magnetic resonance image with respect to a lower side of the human brain by using magnetic resonance signals induced from atomic nuclei located in the lower side of the space for capturing the image of the human brain, from among magnetic resonance signals received, for example, from a second coil. Thereafter, the image generating unit 33 generates a magnetic resonance image with respect to the whole human brain by combining the magnetic resonance image with respect to the upper side of the human brain and the magnetic resonance image with respect to the lower side thereof.

Furthermore, the image generating unit 33 may generate simultaneously a high quality 1H magnetic resonance image and a high quality 23Na magnetic resonance image more promptly by combining the above methods. For example, the signal collecting unit 23 may simultaneously collect portions of magnetic resonance signals corresponding to sodium atomic nuclei several times through reception coils installed at different locations in the space for capturing the target object while collecting magnetic resonance signals corresponding to hydrogen atomic nuclei at one time. The image generating unit 33 may determine some of magnetic resonance signals corresponding to sodium atomic nuclei collected several times, estimate magnetic resonance signals that are not collected from among the magnetic resonance signals corresponding to sodium atomic nuclei based on the determined magnetic resonance signals, and simultaneously generate and combine magnetic resonance images located in different parts of the target object by using the determined magnetic resonance signals and the estimated magnetic resonance signals, thereby generating the 23Na magnetic resonance image.

Thereafter, the image generating unit 33 may convert the 23Na magnetic resonance image into a magnetic resonance image using a color scale, and overlap the converted 23Na magnetic resonance image using the color scale and a 1H magnetic resonance image using a gray scale. The overlapping magnetic resonance images may simultaneously provide anatomy information and metabolism information inside the human body. That is, the gray scale part of the overlapping magnetic resonance image provides the anatomy information inside the human body, and the color scale part thereof provides the metabolism information inside the human body. In general, a magnetic resonance image generated by the magnetic resonance image apparatus of FIG. 1 is a black and white image using the gray scale. Thus, to distinguish the 1H magnetic resonance image and the 23Na magnetic resonance image, a gray scale version of the 23Na magnetic resonance image is converted into a version using a predetermined color scale, for example, a red color scale.

FIG. 9 is a flowchart of a method of generating a magnetic resonance image according to the exemplary embodiment of the present invention. Referring to FIG. 9, the method of generating the magnetic resonance image may include the following steps. The method of generating the magnetic resonance image apparatus of FIG. 9 includes steps which are performed serially in time by the magnetic resonance image apparatus of FIG. 1. The magnetic resonance image apparatus of FIG. 1 and the components thereof may be applied to the method of generating the magnetic resonance image of FIG. 9.

In step 91, the control unit 32 controls a location of the table 15 according to a user instruction input to the user interface 31 so that a target object is located in the center of a static magnetic field generated or to be generated by the main magnet 11. The control unit 32 may operate the main magnet 11 before and after the target object is located in a desired position with respect to the static magnet field.

In step 92, the control unit 32 selects, according to a user instruction input to the user interface 31, one of a plurality of pulse trains of various shapes in which pulses having a plurality of frequencies corresponding to multi-type atomic nuclei are arranged in a line or sequentially as shown in FIGS. 2 through 5, for example, for hydrogen and sodium. In step 93, the control unit 32 controls the first signal generating unit 21 and the second signal generating unit 22 to apply an electromagnetic wave signal, having the pulse train selected in step 92, to the target object by using the RF coil 13 in a magnet field generated by the main magnet 11 and the gradient coil 12. Step 92 is an operation of selecting the most optimal pulse train according to the user instruction, from the pulse trains shown in FIGS. 2 through 5 according to the computer performance of the magnetic resonance image apparatus of FIG. 1 and the performance of the RF coil 13. In an alternative embodiment, step 92 may be skipped, and one pulse train, such as a predetermined pulse train, may be generated and applied repeatedly all the time.

In step 94, the image generating unit 33 collects data of magnetic resonance signals corresponding to the multi-type atomic nuclei received by the RF coil 13 through the signal collecting unit 23. For example, in step 94, the image generating unit 33 collects data of magnetic resonance signals corresponding to hydrogen atomic nuclei and magnetic resonance signals corresponding to sodium atomic nuclei through the signal collecting unit 23. In step 95, the image generating unit 33 simultaneously generates multi-type magnetic resonance images corresponding to the multi-type atomic nuclei by using the data of the magnetic resonance signals collected in step 94. For example, the image generating unit 33 may simultaneously generate a 1H magnetic resonance image and a 23Na magnetic resonance image by using the data of the magnetic resonance signals corresponding to hydrogen atomic nuclei and the magnetic resonance signals corresponding to sodium atomic nuclei collected in step 94.

According to the exemplary embodiment of the present invention described above, a high quality 1H magnetic resonance image and a high quality 23Na magnetic resonance image may be generated simultaneously and promptly. As such, the high quality 1H magnetic resonance image and the high quality 23Na magnetic resonance image are obtained in a short time, thereby increasing a turnover ratio of patients in a hospital, and more accurately diagnosing lesions and other anatomical features which may be indicative of a disease, since a medical expert such as a doctor can diagnose lesions or other illnesses by simultaneously using the high quality 1H magnetic resonance image and the high quality 23Na magnetic resonance image. In particular, the medical expert can simultaneously see anatomy information provided through the high quality 1H magnetic resonance image and metabolism information provided through the high quality 23Na magnetic resonance image, thereby accurately determining a metabolism status of a specific part of the human body.

Thus, using the present invention, multi-type magnetic resonance images can be simultaneously and promptly generated.

The exemplary embodiments of the present invention described above may be written as computer programs and implemented in general-use digital computers that execute programs using a computer readable recording medium. In addition, a data structure used in the embodiments of the present invention may be recorded on a computer-readable recording medium in a variety of ways. Examples of the computer-readable recording medium include magnetic storage media (e.g., ROM, floppy disks, hard disks, etc.) and optical recording media (e.g., CD-ROMs, or DVDs).

The above-described apparatus and methods according to the present invention can be implemented in hardware, firmware or as software or computer code that can be stored in a recording medium such as a CD ROM, a RAM, a ROM, a floppy disk, DVDs, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for generating a magnetic resonance image, the apparatus comprising:
    a coil for receiving a plurality of magnetic resonance signals generated by applying an electromagnetic wave signal having a plurality of pulses corresponding to multi-type atomic nuclei to a target object,
    wherein the coil receives a second magnetic resonance signal generated by applying at least one second pulse having a frequency corresponding to a second type of atomic nucleus to the target object between a time when at least one first pulse having a frequency corresponding to a first type of atomic nucleus is generated and a time when a first magnetic resonance signal generated by applying the at least one first pulse to the target object is received; and
    an image generating unit for generating the magnetic resonance image from the magnetic resonance signals,
    wherein the image generating unit obtains first k space data corresponding to the first magnetic resonance signal and second k space data corresponding to the second magnetic resonance signal in which sampled signals are less than sampled signals in the first k space data.

2. The apparatus of claim 1, further comprising:
    a signal collecting unit for collecting the plurality of magnetic resonance signals received by the coil; and
    wherein the image generating unit generates multi-type magnetic resonance images corresponding to the multi-type atomic nuclei by using the collected magnetic resonance signals.

3. The apparatus of claim 2, wherein the signal collecting unit collects magnetic resonance signals corresponding to the second type of atomic nucleus a plurality of times while collecting magnetic resonance signals corresponding to the first type of atomic nucleus one time from among the magnetic resonance signals.

4. The apparatus of claim 3, wherein the signal collecting unit collects the magnetic resonance signals corresponding to the second type of atomic nucleus a plurality of times with respect to a part of a space for capturing the target object while uniformly collecting the magnetic resonance signals corresponding to the first type of atomic nucleus one time with respect to the whole space for capturing the target object through the coil.

5. The apparatus of claim 4 wherein the image generating unit determines a set of the magnetic resonance signals corresponding to the second type of atomic nucleus collected a plurality of times, estimates magnetic resonance signals that are not collected from among the magnetic resonance signals corresponding to the second type of atomic nucleus based on the determined magnetic resonance signals, and generates a magnetic resonance image corresponding to the second type of atomic nucleus by using the determined magnetic resonance signals and the estimated magnetic resonance signals.

6. The apparatus of claim 2, wherein the signal collecting unit simultaneously collects the magnetic resonance signals corresponding to the second type of atomic nucleus through the reception coils of the coil installed at the different locations in a space for capturing the target object,
    wherein the image generating unit simultaneously generates and combines magnetic resonance images with respect to different parts of the target object by using the collected magnetic resonance signals and generates the magnetic resonance image corresponding to the second type of atomic nucleus.

7. The apparatus of claim 2, wherein the signal collecting unit collects the magnetic resonance signals corresponding to the second type of atomic nucleus a plurality of times with respect to a part of a space for capturing the target object through reception coils of the coil installed at different locations in the space for capturing the target object while uniformly collecting the magnetic resonance signals corresponding to the first type of atomic nucleus one time with respect to the whole space for capturing the target object through the coil.

8. The apparatus of claim 1, wherein the coil receives the second magnetic resonance signal at least once after the time when the first magnetic resonance signal is received.

9. The apparatus of claim 1, wherein the coil generates one second pulse having the frequency corresponding to the second type of atomic nucleus and receives a second magnetic resonance signal generated by applying the one second pulse to the target object, between a time when one first pulse having the frequency corresponding to the first type of atomic nucleus is generated and a time when a first magnetic resonance signal generated by applying the one first pulse to the target object is received.

10. The apparatus of claim 1, wherein the coil generates a plurality of second pulses each having the frequency corresponding to the second type of atomic nucleus and receives magnetic resonance signals of the respective plurality of second pulses generated by applying the plurality of second pulses to the target object, between a time when one first pulse having the frequency corresponding to the first type of atomic nucleus is generated and a time when a first magnetic resonance signal generated by applying the one first pulse to the target object is received.

11. The apparatus of claim 1, wherein the coil generates a plurality of second pulses each having the frequency corresponding to the second type of atomic nucleus and receives a second magnetic resonance signal generated by applying the plurality of second pulses to the target object, between a time when one first pulse having the frequency corresponding to the first type of atomic nucleus is generated and a time when a first magnetic resonance signal generated by applying the one first pulse to the target object is received.

12. The apparatus of claim 1, wherein the coil generates a plurality of second pulses each having the frequency corresponding to the second type of atomic nucleus and receives a second magnetic resonance signal generated by applying the plurality of second pulses to the target object, between a time when one of a plurality of first pulses each having the frequency corresponding to the first type of atomic nucleus is generated and a time when another pulse is generated.

13. The apparatus of claim 12, wherein the coil generates a plurality of third pulses each having the frequency corresponding to the second type of atomic nucleus and receives a third magnetic resonance signal generated by applying the plurality of third pulses to the target object, between the time when the another pulse is generated and a time when a first magnetic resonance signal generated by applying the plurality of first pulses to the target object is received.

14. The apparatus of claim 1, wherein the multi-type atomic nuclei comprise hydrogen atomic nuclei and sodium atomic nuclei.

15. The apparatus of claim 1, wherein the coil applies the electromagnetic wave signal and receives the magnetic resonance signals.

16. The apparatus of claim 1, wherein the coil comprises a transmission coil for applying the electromagnetic wave signal and a reception coil for receiving the magnetic resonance signals.

17. The apparatus of claim 16, wherein the reception coil is one of a dual tune coil, a multi-channel coil, and a dual tuned multi-channel coil.

18. A method of generating a magnetic resonance image, the method comprising:
    applying at least one first pulse having a frequency corresponding to a first type of atomic nucleus to a target object;
    applying at least one second pulse having a frequency corresponding to a second type of atomic nucleus to the target object;
    receiving a second magnetic resonance signal generated by applying the at least one second pulse to the target object;
    receiving a first magnetic resonance signal generated by applying the at least one first pulse to the target object after receiving the second magnetic resonance signal, and obtaining first k space data corresponding to the first magnetic resonance signal and second k space data corresponding to the second magnetic resonance signal in which sampled signals are less than sampled signals in the first k space data.

19. The method of claim 18, further comprising:
    receiving the second magnetic resonance signal once more after receiving the first magnetic resonance signal.

20. The method of claim 18, further comprising:
    generating a plurality of magnetic resonance signals corresponding to multi-type atomic nuclei by using the received first and second magnetic resonance signals.

21. The method of claim 18, further comprising:
    selecting a pulse train from pulse trains of different shapes in which pulses having a plurality of frequencies corresponding to the multi-type atomic nuclei are arranged in a line.

22. A non-transitory computer readable recording medium having recorded thereon a computer program for executing the method of generating a magnetic resonance image, the method comprising:
    applying at least one first pulse having a frequency corresponding to a first type of atomic nucleus to a target object;
    applying at least one second pulse having a frequency corresponding to a second type of atomic nucleus to the target object;
    receiving a second magnetic resonance signal generated by applying the at least one second pulse to the target object;
    receiving a first magnetic resonance signal generated by applying the at least one first pulse to the target object after receiving the second magnetic resonance signal; and
    obtaining first k space data corresponding to the first magnetic resonance signal and second k space data corresponding to the second magnetic resonance signal in which sampled signals are less than sampled signals in the first k space data.

* * * * *

UNITED STATES PATENT AND TRADEMARK OFFICE
CERTIFICATE OF CORRECTION

| | | |
|---|---|---|
| PATENT NO. | : 9,274,194 B2 | Page 1 of 1 |
| APPLICATION NO. | : 13/557627 | |
| DATED | : March 1, 2016 | |
| INVENTOR(S) | : Jin-young Hwang | |

It is certified that error appears in the above-identified patent and that said Letters Patent is hereby corrected as shown below:

Claims

Column 16, Claim 5, Line 12 should read as follows:
--...claim 4, wherein the...--

Column 18, Claim 21, Line 19 should read as follows:
--...to multi-type atomic...--

Column 18, Claim 22, Line 23 should read as follows:
--...a method of generating...--

Signed and Sealed this
Third Day of May, 2016

Michelle K. Lee
*Director of the United States Patent and Trademark Office*